(12) United States Patent
Yabuta et al.

(10) Patent No.: US 9,874,658 B2
(45) Date of Patent: Jan. 23, 2018

(54) LOW REFLECTION COATING GLASS SHEET AND METHOD FOR PRODUCING THE SAME

(71) Applicant: Nippon Sheet Glass Company, Limited, Tokyo (JP)

(72) Inventors: Takeshi Yabuta, Tokyo (JP); Mizuho Koyo, Tokyo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 90 days.

(21) Appl. No.: 14/762,739

(22) PCT Filed: Jan. 24, 2014

(86) PCT No.: PCT/JP2014/000362
§ 371 (c)(1),
(2) Date: Jul. 22, 2015

(87) PCT Pub. No.: WO2014/119267
PCT Pub. Date: Aug. 7, 2014

(65) Prior Publication Data
US 2015/0355381 A1 Dec. 10, 2015

(30) Foreign Application Priority Data

Jan. 31, 2013 (JP) ................................ 2013-017161

(51) Int. Cl.
*G02B 1/11* (2015.01)
*C03C 17/25* (2006.01)
(Continued)

(52) U.S. Cl.
CPC .............. *G02B 1/11* (2013.01); *C03C 17/007* (2013.01); *C03C 17/25* (2013.01); *G02B 1/118* (2013.01);
(Continued)

(58) Field of Classification Search
CPC ........... G02B 1/11; G02B 1/115; G02B 1/118; G02B 5/285; G02B 5/0278; G02B 5/0833;
(Continued)

(56) References Cited

U.S. PATENT DOCUMENTS 6,251,523 B1 6/2001 Takahashi et al.
6,921,578 B2 7/2005 Tsujino et al.
(Continued)

FOREIGN PATENT DOCUMENTS

| JP | 11-292568 | 10/1999 |
|---|---|---|
| WO | 01/42156 | 6/2001 |
| WO | 2011/070714 | 6/2011 |
| WO | 2012/028626 | 3/2012 |

*Primary Examiner* — Jie Lei

(74) *Attorney, Agent, or Firm* — Hamre, Schumann, Mueller & Larson, P.C.

(57) ABSTRACT

In a low reflection coating glass sheet, a low reflection coating is a porous film including solid fine particles containing silicon oxide as a main component and a binder containing silicon oxide. The fine particles are solid particles. At least 70% of the fine particles aggregate to form secondary particles each having an aspect ratio of 1.8 to 5, a minor axis of 20 to 60 nm, and a major axis of 50 to 150 nm, when the aspect ratio is defined as the ratio of the major axis to the minor axis of the secondary particle. The low reflection coating has a thickness of 50 to 250 nm. This low reflection coating has a structure suitable for increasing the transmittance gain.

6 Claims, 2 Drawing Sheets

(51) Int. Cl.
*H01L 31/0236* (2006.01)
*H02S 40/22* (2014.01)
*C03C 17/00* (2006.01)
*G02B 1/118* (2015.01)

(52) U.S. Cl.
CPC ........ *H01L 31/02366* (2013.01); *H02S 40/22* (2014.12); *C03C 2217/732* (2013.01); *C03C 2218/113* (2013.01); *Y02E 10/52* (2013.01)

(58) Field of Classification Search
CPC ....... C03C 17/007; C03C 17/02; C03C 17/25; C03C 17/36; C03C 17/30; C03C 17/245; C03C 2217/732; C03C 2218/113; H02S 40/22; H01L 31/02366; Y02E 10/52; C03B 19/12; B60R 1/088
USPC ....... 359/601, 603, 580, 581, 584, 586, 589; 65/17.2, 60.52, 60.53, 60.8; 428/428, 428/429, 432
See application file for complete search history.

(56) References Cited

U.S. PATENT DOCUMENTS

| | | | |
|---|---|---|---|
| 2002/0014090 A1* | 2/2002 | Tsujino | C03C 1/008 65/17.2 |
| 2012/0244318 A1 | 9/2012 | Koyo et al. | |
| 2013/0163087 A1 | 6/2013 | Lecolley et al. | |

* cited by examiner

_US 9,874,658 B2_

LOW REFLECTION COATING GLASS SHEET AND METHOD FOR PRODUCING THE SAME

TECHNICAL FIELD

The present invention relates to a glass sheet provided with a low reflection coating.

BACKGROUND ART

A low reflection coating is sometimes formed on the surface of a glass or ceramic substrate in order to allow transmission of more light or prevent glare caused by reflection of light and thus to improve the function of the substrate for a specific application.

Glass sheets provided with low reflection coatings are used in vehicle windows, shop windows, photoelectric conversion devices, etc. In a thin-film solar cell as a type of photoelectric conversion device, an undercoating film, a transparent conductive film, a photoelectric conversion layer made of amorphous silicon or the like, and a thin-film back electrode are stacked in this order on one principal surface of a glass sheet, and a low reflection coating is formed on the other principal surface of the glass sheet opposite to the one principal surface. In a crystalline solar cell as another type of photoelectric conversion device, a low reflection coating is formed on the surface of a cover glass disposed on the sunlight incident side. In a solar cell, a low reflection coating is formed on the sunlight incident side as described above, more sunlight is directed to a photoelectric conversion layer or a solar cell element, and thus the amount of electricity generated in the cell is increased.

A most frequently used low reflection coating is a dielectric film formed by vacuum deposition, sputtering, chemical vapor deposition (CVD), or the like. A fine particle-containing film containing fine particles such as fine silica particles is also used as the low reflection coating in some cases. The fine particle-containing film is formed by applying a coating liquid containing the fine particles onto a glass sheet by dip coating, flow coating, spray coating, or the like.

When a fine particle-containing film as a low reflection coating is formed by spray coating, the appearance may significantly deteriorate due to uneven reflection. In order to reduce such deterioration in appearance, for example, WO 2011/070714 A1 (Patent Literature 1) discloses a cover glass for photoelectric conversion devices that includes a glass sheet and a reflection-reducing film (low reflection film) containing fine silica particles, in which the shape of the surface asperities of the glass sheet and the number of layers of the fine silica particles stacked in the peak portions of the surface asperities and that in the valley portions of the surface asperities are adjusted. This cover glass has a reflectance of 1.5% or more and 3% or less over the entire wavelength range of 380 nm to 780 nm for light incident on the reflection-reducing film formed on the glass sheet, and thus the deterioration in appearance due to uneven reflection is reduced.

CITATION LIST

Patent Literature

Patent Literature 1: WO 2011/070714 A1

SUMMARY OF INVENTION

Technical Problem

In a low reflection coating glass sheet including a glass sheet and a fine particle-containing low reflection coating formed on one principal surface of the glass sheet, a transmittance gain defined as an increment of the average transmittance of the glass sheet between before and after the formation of the low reflection coating thereon is evaluated as one of the important performance parameters when the glass sheet is used in a photoelectric conversion device. The higher the transmittance gain is, the more the amount of light transmitted through the glass sheet is, and the higher the efficiency of the photoelectric conversion device is. On the other hand, a low reflection coating requires not only a high transmittance gain but also various other excellent properties such as chemical durability. Therefore, in order to meet the requirements for these properties, an ingredient that slightly lowers the transmittance gain is optionally added to obtain a desired low reflection coating. In view of this, it is desirable for a low reflection coating containing fine particles to have a specific structure made up of the fine particles and suitable for increasing the transmittance gain.

In view of these circumstances, it is an object of the present invention to provide a low reflection coating glass sheet that includes a glass sheet and a fine particle-containing low reflection coating formed on the glass sheet and having a structure suitable for increasing the transmittance gain.

Solution to Problem

The present invention provides a low reflection coating glass sheet including: a glass sheet; and a low reflection coating formed on at least one principal surface of the glass sheet. The low reflection coating is a porous film including fine particles containing silicon oxide as a main component and a binder for binding the fine particles. The binder contains silicon oxide. The fine particles are solid particles. At least 70% of the fine particles aggregate to form secondary particles each having an aspect ratio of 1.8 to 5, a minor axis of 20 to 60 nm, and a major axis of 50 to 150 nm, the aspect ratio being defined as a ratio of the major axis to the minor axis of the secondary particle. The low reflection coating has a thickness of 50 to 250 nm.

Advantageous Effects of Invention

In the low reflection coating glass sheet of the present invention, the low reflection coating has a high porosity due to the presence of secondary particles having parameters such as the above-mentioned aspect ratio. The low reflection coating having a high porosity is suitable for increasing the transmittance gain. The use of solid fine particles is advantageous to maintain a highly porous film structure against external stresses. In the low reflection coating glass sheet according to the present invention, the thickness of the low reflection coating is also appropriately determined to increase the transmittance gain.

DESCRIPTION OF EMBODIMENTS

Figure 1:
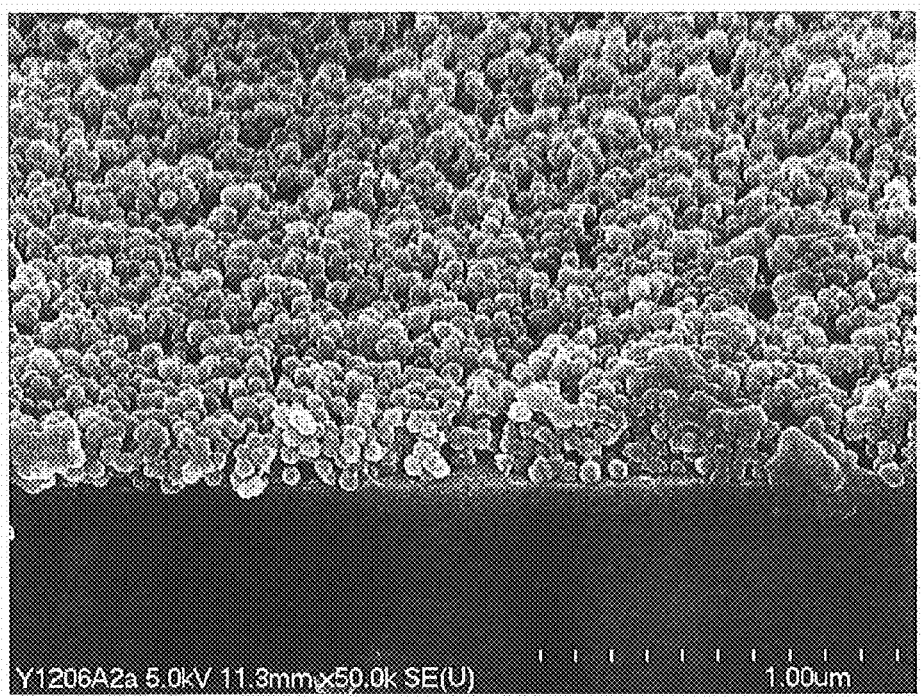
FIG. 1 is a diagram showing the result of observing a low reflection coating glass sheet obtained in Example 1 using a field emission scanning electron microscope (FE-SEM).
Figure 2:
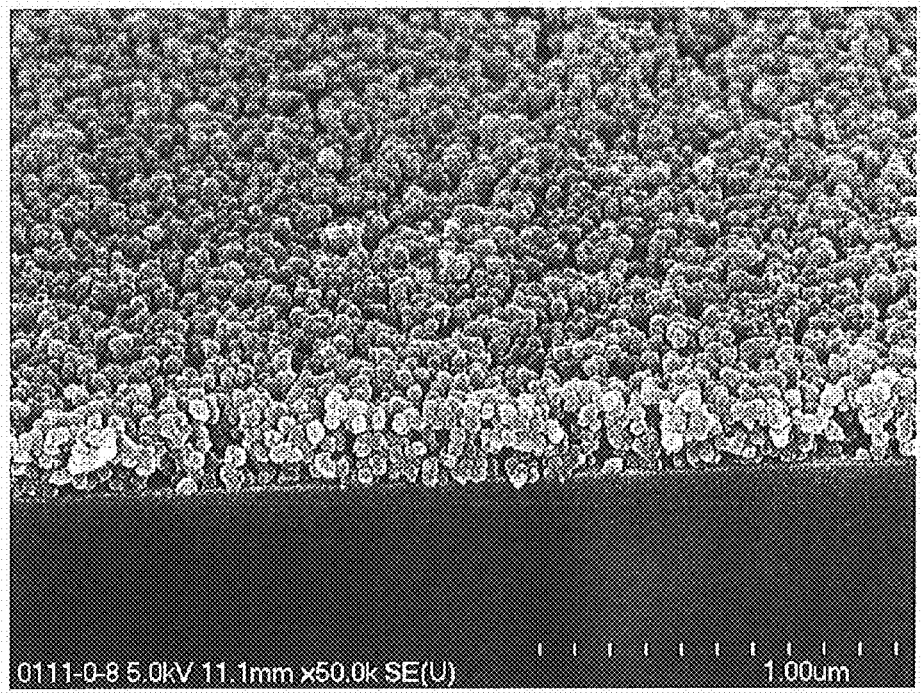
FIG. 2 is a diagram showing the result of observing a low reflection coating glass sheet obtained in Example 4 using a field emission scanning electron microscope (FE-SEM).

Hereinafter, embodiments of the present invention are described, but the present invention is not limited to the following embodiments.

The low reflection coating glass sheet of the present invention includes a glass sheet and a low reflection coating formed on at least one principal surface of the glass sheet. The glass sheet may be a float glass sheet having a smooth principal surface with an arithmetic average roughness Ra of, for example, 1 nm or less, preferably 0.5 nm or less, and further may be a float glass sheet having one principal surface coated with a low reflection coating and the other, opposite principal surface coated with another coating including a transparent conductive film. Here, the arithmetic average roughness Ra is the value specified in Japanese Industrial Standards (JIS) B 0601-1994.

On the other hand, the glass sheet may be a figured glass sheet having a surface with asperities, and the average spacing Sm between the adjacent asperities is 0.3 mm or more and 2.5 mm or less. The average spacing Sm is preferably 0.3 mm or more, particularly preferably 0.4 mm or more, more particularly preferably 0.45 mm or more. The average spacing Sm is preferably 2.5 mm or less, more preferably 2.1 mm or less, particularly preferably 2.0 mm or less, and more particularly preferably 1.5 mm or less. Here, the average spacing Sm refers to the average value of the lengths of peak-to-valley periods in a roughness profile which are determined based on points at which the roughness profile intersects a mean line. In addition, it is preferable that the surface asperities of the figured glass sheet have, in addition to an average spacing Sm within the above-specified range, a maximum height Ry of 0.5 μm to 10 μm, particularly 1 μm to 8 μm. Here, the average spacing Sm and the maximum height Ry are the values specified in JIS B 0601-1994.

Furthermore, it is preferable that the surface asperities of the glass sheet have an arithmetic surface roughness Ra of 0.3 μm to 5.0 μm, particularly 0.4 μm to 2.0 μm, more particularly 0.5 μm to 1.2 μm, in addition to an average spacing Sm within the above-specified range and a maximum height Ry within the above-specified range. The figured glass sheet having the surface asperities as described above is fully effective in preventing glare, but on the other hand, when these roughness parameters are too large, the glass sheet is more susceptible to unevenness of reflected color in the surface.

The glass sheet may have a same composition as that of a common figured glass sheet or an architectural glass sheet, but preferably it contains no, or the least possible amount of, coloring component. In the glass sheet, the content of iron oxide as a typical coloring component is preferably 0.06 wt. % or less, particularly preferably 0.02 wt. % or less, as calculated in terms of $Fe_2O_3$ content.

The low reflection coating contains solid fine particles containing silicon oxide as a main component, and these fine particles form the framework of the low reflection coating. As commonly used, the "main component" refers to a component whose content is at least 50 wt. % in the low reflection coating. At least 70% of the fine particles are "high aspect ratio particles". When the aspect ratio of a particle is defined as the ratio of the major axis to the minor axis of the particle, high aspect ratio particles refer to particles having an aspect ratio of 1.8 to 5, a minor axis of 20 to 60 nm, and a major axis of 50 to 150 nm. They may be long, linear particles, thin, flat particles, or three-dimensional particles. Specifically, the high aspect ratio particles are secondary particles formed by aggregation or agglomeration of fine particles as primary particles.

In a low reflection coating consisting of particles with low aspect ratios of less than 1.8, for example, spherical particles, the particles tend to be relatively closely packed in the low reflection coating. However, the high aspect ratio particles as described above cannot be closely packed because they hinder one another, and thereby relatively large voids are formed between the particles in the resulting low reflection coating. On the other hand, particles with too high aspect ratios of more than 5, for example, needle-like particles tend to be brought into close contact with each other to form parallel rows, and thereby smaller voids are more likely to be formed in the resulting low reflection coating.

The above-described effect of the high aspect ratio particles, that is, the effect of making a low reflection coating especially highly porous can be obtained not only in the case where all of the fine particles consist of the high aspect ratio particles but also in the case where at least 70% of the fine particles as primary particles are present in the form of high aspect ratio secondary particles.

On the other hand, in order to increase the average transmittance in the wavelength range of 380 nm to 1100 nm, the thickness of the low reflection coating is desirably 5 to 250 nm. In order to obtain the thickness in this range more easily, it is desirable that the minor axes of the high aspect ratio particles be 20 to 60 nm and the major axes of the particles be 50 to 150 nm.

The high aspect ratio secondary particles may be secondary particles each formed by aggregation of two to five fine particles as primary particles. Preferably, the primary particles are substantially spherical fine particles having substantially the same dimensions. Substantially spherical primary silica particles with uniform dimensions are mass produced on a commercial scale, and secondary particles each formed by controlled aggregation of two to five primary particles also have high availability in terms of quality, quantity, and cost. The "substantially spherical" particle refers to a particle in which the ratio of the longest dimension of the particle passing through its center of gravity to the shortest dimension thereof is 1.6 or less, preferably 1.4 or less. The "substantially the same dimensions" means that the average particle size of at least 90%, preferably at least 95%, of fine particles is within a range of plus or minus 20%, preferably plus or minus 15%, of the average particle size of all the fine particles. The average particle size of particles is determined from the average value of the shortest dimensions and the longest dimensions of the particles. The shortest dimensions and the longest dimensions are determined based on the result of observation with a scanning electron microscope.

The high aspect ratio secondary particles may be secondary particles each formed by linear aggregation of two or three fine particles as primary particles. In these secondary particles, for example, the minor axes are 25 to 50 nm (preferably 30 to 50 nm), the major axes are 55 to 120 nm, and the aspect ratios are 1.8 to 3. In the case of secondary particles each formed by linear aggregation of three primary particles, they may have a linear or curved shape. Fine particles other than the secondary particles may be present in the form of unaggregated primary particles. In a preferred embodiment, the fine particles are composed of secondary particles each formed by aggregation of two primary particles and unaggregated primary particles.

The high aspect ratio secondary particles may be secondary particles each formed by aggregation of at least three primary particles, and in each of the secondary particles, one primary particle and the remaining two or more primary particles may aggregate together.

Specifically, at least three primary particles may aggregate to form a flat, polygonal shape such as a triangle or a quadrilateral, or at least four primary particles may aggregate to form a pyramid such as a triangular pyramid or a quadrangular pyramid, or a bipyramid formed by joining two pyramids base to base.

Hollow fine particles containing silicon oxide as a main component are commercially available, but solid (not hollow) fine particles, in particular, solid fine particles that are composed of silica should be used because abrasion resistance also is an important factor to be considered when a low reflection coating is used particularly in a solar cell.

The low reflection coating includes a silicon oxide-containing binder in addition to the fine particles. The binder is present between the fine particles and the glass sheet and between the adjacent fine particles, and serves to increase the bonding strength between them. An oxide of a metal such as silicon, titanium, aluminum, zirconium, or tantalum can be used as the binder, but preferably, the binder contains silicon oxide as a main component. Silicon oxide has high affinity for the fine silica particles and the glass sheet containing silicon oxide as a main component, and is thus excellent as a reinforcing agent. Also, silicon oxide has a low refractive index, and thus does not impair the transmittance-increasing effect of the low reflection coating. As described later, the binder preferably contains another metal oxide in addition to silicon oxide to exert its effects such as increasing the durability.

A hydrolyzable metal compound typified by silicon alkoxide can be used as a source of the binder. Examples of the silicon alkoxide include tetramethoxysilane, tetraethoxysilane, and tetraisopropoxysilane. The hydrolyzable metal compound may be hydrolyzed and condensation-polymerized into a binder by a so-called sol-gel process.

The hydrolysis of the hydrolyzable metal compound is preferably carried out in a solution in which the fine particles are present. This is because the condensation polymerization reaction between silanol groups present on the surfaces of the fine silica particles and silanol groups produced from hydrolysis of the metal compound such as silicon alkoxide is promoted, and the proportion of the binder contributing to enhancement of the bonding force of the fine silica particles is increased. Specifically, a coating liquid is preferably prepared by adding a hydrolysis catalyst and silicon alkoxide sequentially to a solution containing fine silica particles while stirring the solution.

The ratio by weight of the silicon oxide component contained in the fine particles and the silicon oxide component contained in the binder is preferably 90:10 to 97:3, more preferably 92:8 to 97:3, and particularly preferably 93:7 to 96:4, as calculated in terms of $SiO_2$ content. The low reflection coating composed of the fine particles and the binder which are contained at a ratio within the above-specified range has appropriate voids provided in the framework formed of the fine particles, and thus is suitable for increasing the transmittance gain of the low reflection coating glass sheet. As a result of the voids being provided in the framework formed of the fine particles, the apparent refractive index of the film decreases, and the reflection-reducing effect increases, in addition to which the binder contributes to maintaining the strength of the framework formed of the fine particles. If the proportion of the binder is too high, the voids between the fine particles are lost. Conversely, if the proportion of the binder is too low, the strength of the framework formed of the fine particles decreases.

Preferably, at least one metal oxide selected from zirconium oxide ($ZrO_2$), titanium oxide ($TiO_2$) and zinc oxide (ZnO) is further added to the low reflection coating in addition to the silicon oxide components contained in the fine particles and the binder.

Preferably, the low reflection coating further contains 2 to 6 parts by weight (3 to 5 parts by weight) of zirconium oxide, 3 to 8 parts by weight (2 to 7 parts by weight) of titanium oxide, and 0 to 7 parts by weight (0 to 5 parts by weight) of zinc oxide per 100 parts by weight, in total, of the silicon oxide component contained in the fine particles and the silicon oxide component contained in the binder, to the extent that a total content of zirconium oxide, titanium oxide, and zinc oxide is within a range of 5 to 17 parts by weight. The values in parentheses are more preferable contents.

The addition of zirconium oxide in an amount in the above-specified range significantly improves the alkali resistance of the low reflection coating. When the amount of added zirconium oxide is less than 2 parts by weight, the alkali resistance is not improved. On the other hand, when the amount of added zirconium oxide is more than 6 parts by weight, the transmittance gain of the low reflection coating decreases. Presumably, this is because zirconium oxide has a higher refractive index than silicon oxide. When an excessive amount of zirconium oxide is added, the refractive index of the entire low reflection coating is increased too much beyond its appropriate range, resulting in a decrease in the transmittance gain of the low reflection coating.

The addition of titanium oxide in an amount in the above-specified range improves the transmittance gain of the low reflection coating. When the amount of added titanium oxide is less than 3 parts by weight, the transmittance gain is not improved. When the amount of added titanium oxide is more than 8 parts by weight, the transmittance gain rather decreases. It is not clear why the addition of titanium oxide in an amount in a specific range increases the transmittance gain although, like zirconium oxide, titanium oxide has a higher refractive index than silicon oxide. The inventors presume that this is because the addition of titanium oxide to the low reflection coating makes the binder denser, the denser binder increases the porosity of the film, and thus reduces the apparent refractive index of the film accordingly.

The addition of zinc oxide in an amount in the above-specified range significantly improves the moisture resistance of the low reflection coating. In order to ensure the improvement of the moisture resistance, it is recommended to add at least 3 parts by weight of zinc oxide. However, when the amount of added zinc oxide is more than 7 parts by weight, the moisture resistance rather decreases. Zinc oxide added to the low reflection coating constitutes a part of the binder. Alkaline components contained in the glass sheet are likely to dissolve and leach from the glass sheet when exposed to moisture, the leached alkaline components impair the adhesion between the glass sheet and the binder, and thus deteriorates the moisture resistance of the low reflection coating. Presumably, zinc ions in zinc oxide added to the binder effectively reduces the leaching of the alkaline components, maintains the adhesion between the low reflection coating and the glass sheet, and thus improves the moisture resistance of the low reflection coating.

More preferably, the total amount of added zirconium oxide, titanium oxide, and zinc oxide is 8 to 17 parts by weight. When the total amount is more than 17 parts by weight, the refractive index of the entire low reflection coating is inappropriately increased, and thus the transmittance gain thereof decreases in some cases.

With the low reflection coating as described above, the transmittance gain can be increased, for example, to 2.5% or more, even to 2.6% or more, particularly to 2.7% or more, and to 2.9% or more in some cases. It is also possible to obtain a transmittance gain of 2.5% or more with a conventionally known low reflection coating. However, the film structure of the low reflection coating of the present invention is more advantageous in obtaining a high transmittance gain than, for example, a low reflection coating not containing high aspect ratio secondary particles. Therefore, it is easier to achieve a good balance between the transmittance gain and other properties (such as alkali resistance). In this description, the value of the transmittance gain is expressed as an increment of the average transmittance of the glass sheet between before and after the formation of the low reflection coating thereon, as measured at wavelengths ranging from 380 to 1100 nm.

The fine particle-containing low reflection coating can be formed by supplying a coating liquid containing the fine particles and a compound serving as a source of the binder onto the surface of the glass sheet, and drying and then heating the coating liquid. The supply of the coating liquid may be done by a known technique and is not particularly limited. Examples of the technique include: methods using apparatuses such as a spin coater, a roll coater, a spray coater, and a curtain coater; methods such as dip coating and flow coating; various printing methods such as screen printing, gravure printing, and curved surface printing; and spray coating. Spray coating is suitable for mass production because of its high production efficiency.

Spray coating is suitable for mass production in terms of production efficiency, but has a problem in that non-uniformity of the film thickness is likely to occur when applied to mass production. This non-uniformity is due to the coating liquid sprayed in the form of mist from a spray gun or due to overlapping distribution (spray pattern) of the mist, and appears as uneven reflected color portions with a diameter of about several millimeters.

The color unevenness caused by spray coating may be visually observed regardless of whether the surface of the glass sheet on which the low reflection coating is formed is smooth or has asperities. However, the color unevenness can be eliminated effectively by adding a surfactant to the coating liquid and by using a specific solvent for the coating liquid.

The method of forming the low reflection coating on the glass sheet by spray coating will be described. First, a glass sheet is prepared. A coating liquid containing fine particles and a metal compound serving as a source of a binder is sprayed onto the glass sheet. The spraying of the coating liquid is carried out, for example, by applying the coating liquid from above to the horizontally held glass sheet using a spray gun placed at a constant distance from the glass sheet.

Next, the glass sheet sprayed with the coating liquid is placed, for example, in an electric furnace set at 350° C. for 80 seconds to dry the coating liquid to remove a solvent and the like contained in the coating liquid. Furthermore, the glass sheet is placed, for example, in an electric furnace set at 760° C. for 4 minutes to form an oxide from the metal compound contained in the coating liquid and thus to produce the binder. Thus, the low reflection coating is formed.

It is preferable to add a surfactant to the coating liquid. A silicone-based surfactant or a fluorine-based surfactant is suitable as the surfactant, but a fluorine-based surfactant is particularly suitable. The concentration of the surfactant in the coating liquid is preferably 0.005 wt. % or more and 0.5 wt. % or less, and particularly preferably 0.01 wt. % or more and 0.3 wt. % or less. It is presumed that, as a result of the addition of a surfactant, the surface tension of the coating liquid is reduced, the thickness of the liquid film of the coating liquid is averaged as the liquid film is concentrated during the drying of the coating liquid supplied to the surface of the glass sheet, and thus a desired low reflection coating is formed.

Another aspect of the present invention provides a method for producing the low reflection coating glass sheet according to the present invention. This production method includes: the steps of: applying a coating liquid containing fine particles and a metal compound onto at least one principal surface of a glass sheet, the fine particles containing silicon oxide as a main component, and the metal compound serving as a source of a binder for binding the fine particles, the binder containing silicon oxide; and heating the glass sheet on which the coating liquid is applied so as to produce the binder from the metal compound and thus to form a low reflection coating. The fine particles are solid particles, and at least 70% of the fine particles aggregate to form secondary particles each having an aspect ratio of 1.8 to 5, a minor axis of 20 to 60 nm, and a major axis of 50 to 150 nm, the aspect ratio being defined as a ratio of the major axis to the minor axis of the secondary particle. The coating liquid is applied onto the glass sheet so as to form thereon the low reflection coating with a thickness of 50 to 250 nm.

EXAMPLES

Hereinafter, the present invention will be described in more detail with reference to examples. First, methods of evaluating the properties of each of low reflection coating glass sheets obtained in examples and comparative examples will be described.

(Surface Profile Measurement of Figured Glass Sheet)

The arithmetic average roughness Ra, the maximum height Ry, and the average spacing Sm of surface asperities of a figured glass sheet were determined by averaging values measured at ten measurement points using a non-contact three-dimensional profile measuring instrument (NH-3N, manufactured by Mitaka Kohki Co., Ltd.) according to JIS B 0601-1994 with an evaluation length set at 5.0 mm and a cut-off wavelength set at 2.5 mm. In addition, the average inclination angle θ was determined using the arithmetic average roughness Ra and the average spacing Sm.

(Reflection Properties)

The reflectance curve (reflection spectrum) of the surface on which the low reflection coating was formed was measured using a spectrophotometer (UV-3100, manufactured by Shimadzu Corporation). The measurement was performed, according to JIS K 5602, by directing light incident on the surface in a normal direction and introducing light directly reflected at an angle of 8° into an integrating sphere. The average reflectance was calculated by averaging reflectances at wavelengths ranging from 380 nm to 1100 nm. In addition, the reflectance curve of the glass sheet before formation of the low reflection coating and the reflectance curve of the low reflection coating glass sheet obtained by forming the low reflection coating on the glass sheet were measured, and a decrement of the average reflectance of the glass sheet between before and after the formation of the low reflection coating on the glass sheet was defined as a reflectance loss. In the measurement, black paint was applied to the back surface (the surface not subjected to the measurement) of the glass sheet to eliminate reflected light from the back surface, and correction was made based on a standard specular reflector.

(Transmission Properties)

The transmittance curves (transmission spectra) of the glass sheet were measured before and after the formation of the low reflection coating on the glass sheet, using the above-mentioned spectrophotometer. The average transmittance was calculated by averaging transmittances at wavelengths ranging from 380 to 1100 nm. An increment of the average transmittance of the glass sheet between before and after the formation of the low reflection coating on the glass sheet was defined as a transmittance gain.

(Appearance Evaluation)

The appearance of the low reflection coating glass sheet was visually evaluated based on the following criteria.

Good: There is no variation or there is only slight variation, if any, in reflected color depending on the region of the low reflection coating glass sheet, and the color evenness is good.

Poor: There is considerably greater variation in reflected color depending on the region of the low reflection coating glass sheet, and the color evenness is poor.

(Measurement of Coating Thickness by SEM Observation)

The low reflection coating was observed with a field emission scanning electron microscope (FE-SEM) (5-4500, manufactured by Hitachi, Ltd.). The average thickness of the low reflection coating was obtained by averaging values measured at five measurement points based on a FE-SEM photograph, taken from above at an angle of 30°, of the cross-section of the low reflection coating, and defined as the thickness of the low reflection coating. In the case where a figured glass sheet was used as the glass sheet, the thicknesses thereof were measured at the valley portions of the asperities of the surface of the figured glass sheet.

(Alkali Resistance Evaluation)

The alkali resistance of the obtained low reflection coating glass sheet was evaluated by the following method. The low reflection coating glass sheet was immersed in a saturated aqueous solution of calcium hydroxide having a temperature of 60° C. for 9 hours. The change in appearance before and after the immersion was visually observed, in addition to which transmittances were measured by a haze meter (NDH 2000 manufactured by NIPPON DENSHOKU INDUSTRIES CO., LTD.) before and after the immersion. The alkali resistance was evaluated based on the absolute value of the difference between the transmittances.

(High Temperature High Humidity Test)

In order to evaluate the moisture resistance of the obtained low reflection coating glass sheet, the high temperature high humidity test was performed. The low reflection coating glass sheet was placed in a chamber set at a temperature of 85° C. and a relative humidity of 85% and left for 1000 hours, and the average transmittances of the low reflection coating glass sheet were measured before and after being placed in the chamber, using the above-mentioned spectrophotometer. Thus, the moisture resistance was evaluated based on the absolute value of the difference between the transmittances.

Example 1

Preparation of Coating Liquid 49.8 parts by weight of a fine silica particle dispersion liquid (PL-3, manufactured by FUSO CHEMICAL CO., LTD., average primary particle size=35 nm, minor axis and major axis of secondary particles formed by aggregation of the primary particles=35 nm and 70 nm respectively, solid content concentration=20 wt. %), 47.5 parts by weight of ethyl cellosolve, and 1 part by weight of 1N hydrochloric acid (hydrolysis catalyst) were mixed with stirring. With further stirring, 1.7 parts by weight of tetraethoxysilane was added to the mixture, which was then stirred for further 8 hours with its temperature maintained at 40° C. Thus, a raw material liquid was obtained. In this raw material liquid, the solid content concentration was 10 wt. %, and in this solid content, the ratio by weight of the silicon oxide component contained in the fine particles to the silicon oxide component contained in the binder was 95:5, as calculated in terms of $SiO_2$ content. It should be noted that the fine particles were solid (i.e., non-hollow) fine particles.

When this PL-3 fine silica particle dispersion liquid was observed with a SEM (a drop of this liquid was placed on a clean microscope slide and the dispersion medium was vaporized to obtain only the fine particles), the primary particles were substantially spherical particles having substantially the same particle size. Furthermore, as a result of the observation, some of the primary particles were present in the form of individual particles and the other primary particles aggregated two by two to form secondary particles. About 80% of the total number of primary particles were present in the form of secondary particles and the remaining about 20% thereof were present in the form of individual primary particles.

10 parts by weight of the raw material liquid, 67.69 parts by weight of 1-methoxy-2-propanol, 5 parts by weight of ethylene glycol, 16.38 parts by weight of 2-propanol, 0.1 parts by weight of fluorine-based surfactant (Ftergent 251, manufactured by NEOS COMPANY LIMITED), 0.16 parts by weight of 50% aqueous solution of zirconium oxychloride octahydrate (reagent grade, manufactured by KANTO CHEMICAL CO., INC.), 0.3 parts by weight of 75% isopropyl alcohol solution of a chelated titanium compound (titanium (diisopropoxide)bis-(2,4-pentanedionate), manufactured by Sigma-Aldrich), and 0.37 parts by weight of 50% aqueous solution of zinc nitrate hexahydrate (reagent grade, manufactured by KANTO CHEMICAL CO., INC.) were mixed with stirring. Thus, a coating liquid was obtained. In this coating liquid, the solid content concentration was 1.1 wt. %, and the surfactant concentration was 0.01 wt. %. In this coating liquid, the ratio by weight of $SiO_2$, $ZrO_2$, $TiO_2$, and ZnO was 100:3:5:3, as calculated in terms of oxide content.

<Formation of Low Reflection Coating (Low Reflection Film)>

A figured glass sheet having a soda-lime-silicate composition (manufactured by Nippon Sheet Glass Co. Ltd., size=100 mm×300 mm, thickness=3.2 mm) was subjected to ultrasonic alkaline washing, and thus was prepared as a substrate for formation of a low reflection film. The surface profile of this figured glass sheet was such that the surface asperities had an arithmetic average roughness Ra of 1.1 µm, a maximum height Ry of 6.1 µm, an average spacing Sm of 0.79 mm, and an average inclination angle θ of 0.32°, as defined by $\theta=\tan^{-1}(4Ra/Sm)$. The reflection properties and the transmission properties of this figured glass sheet were measured by the above-described methods, and it was found that the average reflectance was 4.5% and the average transmittance was 91.6%.

The coating liquid was applied onto the figured glass sheet by spray coating. The spray coating was performed using a commercially-available spray gun in such a manner that the coating liquid was sprayed from above onto the figured glass sheet held horizontal. At this time, the spray gun and the figured glass sheet were moved relative to each other while the distance between the spray gun and the figured glass sheet was kept constant. Next, this figured glass sheet was placed in an electric furnace set at 350° C. for 80 seconds to remove the solvent of the coating liquid, and was then placed in an electric furnace set at 760° C. for 4 minutes for calcination. Thus, a low reflection coating glass sheet was obtained. The low reflection coating glass sheet thus obtained was evaluated for the above-described properties. Table 1 shows the evaluation results, and Table 4 shows the production conditions. FIG. 1 shows the result of the FE-SEM observation of the cross section of the low reflection coating produced.

Example 2 to Example 21

Low reflection coating glass sheets according to Examples 2 to 21 were obtained in the same manner as in Example 1, except that the proportions of the materials for preparing glass sheets, raw material liquids and coating liquids, and the conditions for forming low reflection coatings (drying conditions and calcination conditions) were as shown in Tables 4 and 5. In Example 13, the coating liquid was applied onto the glass sheet by roll coating (gravure coating) using a roll coater (gravure coater). In addition, in some Examples, a silicon-based surfactant (L7001, manufactured by Dow Corning Toray Co., Ltd.) was used as a surfactant instead of a fluorine-based surfactant.

As shown in Table 2, the low reflection coating glass sheet of Example 2 was obtained in the same manner as in Example 1 except that a commercially available float glass sheet (manufactured by Nippon Sheet Glass, Co., Ltd., size=10 mm×300 mm, thickness=3.2 mm, Ra=1 nm, average reflectance=4.1%, average transmittance=92.0%) was used as a glass sheet.

The low reflection coating glass sheet of Example 4 was obtained in the same manner as in Example 1, except that a fine silica particle dispersion liquid PL-3H, manufactured by FUSO CHEMICAL CO., LTD. (average primary particle size=35 nm, minor axis and major axis of secondary particles formed by aggregation of the primary particles=35 nm and 100 nm respectively, solid content concentration=20 wt. %) was used instead of a fine silica particle dispersion liquid PL-3 used in Example 1.

As a result of the SEM observation of this fine silica particle dispersion liquid PL-3H in the same manner as described above, some of the almost spherical primary particles were in the form of individual particles and the other primary particles aggregated to form secondary particles of two or three primary particles. About 90% of the total number of primary particles were present in the form of secondary particles and the remaining about 10% thereof were present in the form of individual primary particles. Also in this dispersion liquid, the primary particles were substantially spherical in shape and had substantially the same particle size.

The low reflection coating glass sheets according to Examples 2 to 21 thus obtained were evaluated for the above-described properties. Tables 1 and 2 show the evaluation results.

Comparative Example 1 and Comparative Example 2

Low reflection coating glass sheets according to Comparative Examples 1 and 2 were obtained in the same manner as in Example 1, except that the proportions of the materials for preparing raw material liquids and coating liquids, and the conditions for forming low reflection coatings (drying conditions and calcination conditions) were as shown in Table 6.

Here, in Comparative Examples 1 and 2, PL-3L manufactured by FUSO CHEMICAL CO., LTD. (substantially spherical fine silica particles having an average particle size of 35 nm and a solid content concentration of 20 wt. %) and PL-7 manufactured by the company (substantially spherical fine silica particles having an average particle size of 100 nm and a solid content concentration of 23 wt. %) were used respectively instead of PL-3 manufactured by the company and used in Example 1 as a fine silica particle dispersion liquid. In addition, in Comparative Example 2, a silicon-based surfactant (L7001, manufactured by Dow Corning Toray Co., Ltd.) was used as a surfactant instead of a fluorine-based surfactant.

Figure 3:
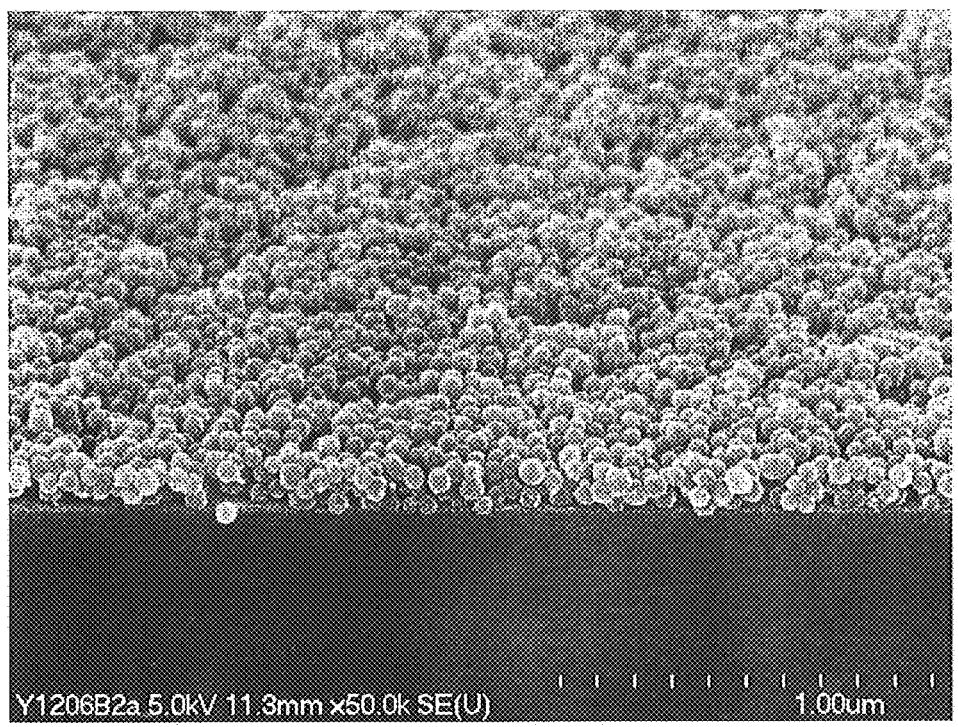
FIG. 3 is a diagram showing the result of observing a low reflection coating glass sheet obtained in Comparative Example 1 using a field emission scanning electron microscope (FE-SEM).
Figure 4:
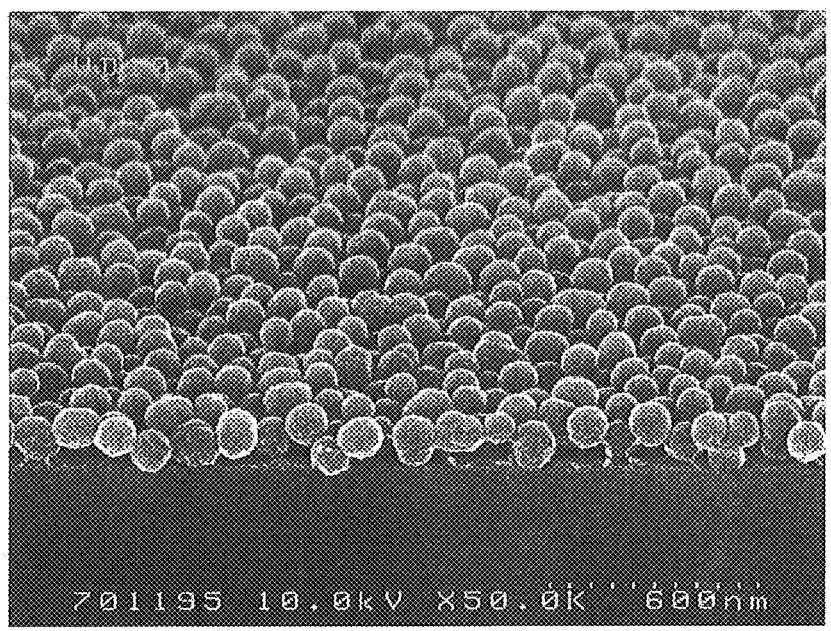
FIG. 4 is a diagram showing the result of observing a low reflection coating glass sheet obtained in Comparative Example 2 using a field emission scanning electron microscope (FE-SEM).

In these PL-3L and PL-7, all of the fine silica particles were present in the form of unaggregated individual primary particles. The low reflection coating glass sheets according to Comparative Examples 1 and 2 thus obtained were evaluated for the above-described properties. Table 3 shows the evaluation results. FIG. 3 and FIG. 4 respectively show the results of the FE-SEM observation of the cross sections of the low reflection coatings according to Comparative Examples 1 and 2.

In comparison between FIG. 1 and FIG. 3, it is observed that the low reflection coating of Example 1 has more voids than the low reflection coating of Comparative Example 1. As shown in Table 1 and Table 3, the transmittance gain in Example 1 was 2.68, while the transmittance gain in Comparative Example 1 was 2.54, and the transmittance gain in Comparative Example 2 was 2.21.

For the difference in the transmittance gain between Example 1 and Comparative Example 1, the present inventors presume as follows. The only difference between Example 1 and Comparative Example 1 is that the fine particles are present in the form of secondary particles each formed by aggregation of two spherical primary particles in Example 1 and the fine particles are present in the form of unaggregated spherical primary particles in Comparative Example 1. A liquid film that has just been sprayed has a low solid content concentration, and particles are suspended in a non-contact manner in the liquid. As the volatile components in the liquid film are vaporized, the liquid level falls, and finally the particles come into contact with each other and with the surface of the glass sheet. In the case where the particles consist of spherical particles, even if a point of each particle comes into contact with another particle or the surface of the glass sheet, the particles can move by rolling, and as a result, form a structure in which the particles are sufficiently settled on the surface. In contrast, once high aspect ratio particles come into contact with each other, their subsequent movement is blocked due to their geometry, and as a result, a structure in which the particles are not sufficiently settled is formed. Then, as the liquid components are vaporized, larger voids are formed between the high aspect ratio particles than in the case of the particles consisting of spherical particles.

As shown in Table 1, the low reflection coating glass sheets according to Examples 1 to 10 exhibited excellent properties, i.e., transmittance changes of 1% or less after the high temperature high humidity test and after the alkali resistance test while achieving transmittance gains of 2.6% or more. The average reflectances of these glass sheets were lower than 1.8% and the reflectance losses thereof were higher than 2.7%.

TABLE 1

| | Example | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Type of fine particles | PL-3 | PL-3 | PL-3 | PL-3H | PL-3H | PL-3H | PL-3 | PL-3 | PL-3 | PL-3 | PL-3 | PL-3 | PL-3H |
| Amount of fine particles [ratio by weight] | 95.0 | 95.0 | 97.0 | 95.0 | 93.0 | 93.0 | 95.0 | 95.0 | 95.0 | 95.0 | 95.0 | 95.0 | 95.0 |
| Amount of binder [ratio by weight] | 5.0 | 5.0 | 3.0 | 5.0 | 7.0 | 7.0 | 5.0 | 5.0 | 5.0 | 5.0 | 5.0 | 5.0 | 5.0 |
| Amount of added $ZrO_2$ [parts by weight] | 3.0 | 3.0 | 3.0 | 3.0 | 3.0 | 3.0 | 5.0 | 2.0 | 3.0 | 3.0 | 3.0 | 3.0 | 3.0 |
| Amount of added $TiO_2$ [parts by weight] | 5.0 | 5.0 | 5.0 | 5.0 | 5.0 | 5.0 | 5.0 | 5.0 | 8.0 | 3.0 | 5.0 | 5.0 | 5.0 |
| Amount of ZnO [parts by weight] | 5.0 | 5.0 | 5.0 | 2.0 | 0.0 | 5.0 | 5.0 | 5.0 | 5.0 | 5.0 | 7.0 | 3.0 | 3.0 |
| Solid content concentration in coating liquid [wt. %] | 1.1 | 1.1 | 1.1 | 0.9 | 0.9 | 1.1 | 1.1 | 1.1 | 1.1 | 1.1 | 1.1 | 1.1 | 4.8 |
| Figured substrate Sm [µm] | 790 | Float glass sheet Ra: 1 nm | 790 | 790 | 790 | 790 | 790 | 790 | 790 | 790 | 790 | 790 | 790 |
| Figured substrate Ra [µm] | 1.1 | | 1.1 | 1.1 | 1.1 | 1.1 | 1.1 | 1.1 | 1.1 | 1.1 | 1.1 | 1.1 | 1.1 |
| Average inclination angle θ [°] | 0.32 | | 0.32 | 0.32 | 0.32 | 0.32 | 0.32 | 0.32 | 0.32 | 0.32 | 0.32 | 0.32 | 0.32 |
| Thickness of coating (at valley portion) [µm] | 185 | — | 183 | 185 | 185 | 182 | 178 | 174 | 192 | 190 | 192 | 190 | 169 |
| Reflected color | Very light blue | | Very light blue | Light blue | Very light blue | Very light blue | Very light blue | Very light blue | Very light blue | Very light blue | Very light blue | Very light blue | Blue |
| Appearance evaluation | Good | Good | Good | Good | Good | Good | Good | Good | Good | Good | Good | Good | Good |
| Transmittance gain [%] | 2.68 | 2.72 | 2.72 | 2.73 | 2.63 | 2.73 | 2.61 | 2.69 | 2.63 | 2.61 | 2.62 | 2.64 | 2.89 |
| Average reflectance [%] | 1.7 | 1.7 | 1.6 | 1.7 | 1.8 | 1.8 | 1.8 | 1.70 | 1.73 | 1.76 | 1.74 | 1.75 | 1.5 |
| Reflectance loss [%] | −2.88 | −2.86 | −2.94 | −2.92 | −2.79 | −2.71 | −2.76 | −2.86 | −2.81 | −2.79 | −2.78 | −2.81 | −3.02 |
| High temperature high humidity test Transmittance change [%] | 0.09 | 0.1 | −0.29 | 0.34 | 0.52 | −0.15 | 0.05 | −0.25 | −0.11 | −0.14 | −0.03 | −0.19 | −0.23 |
| Alkali resistance evaluation Transmittance change [%] | −0.13 | −0.15 | −0.79 | −0.24 | −0.54 | −0.05 | −0.03 | −0.31 | −0.35 | −0.28 | −0.31 | −0.28 | −0.35 |

Amount added [parts by weight]: Amount added is expressed in parts by weight per 100 parts by weight, in total, of fine particles and a binder (in terms of silica content)

TABLE 2

| | Example | | | | | | | |
|---|---|---|---|---|---|---|---|---|
| | 14 | 15 | 16 | 17 | 18 | 19 | 20 | 21 |
| Type of fine particles | PL-3 | PL-3 | PL-3 | PL-3 | PL-3 | PL-3 | PL-3 | PL-3 |
| Amount of fine particles [ratio by weight] | 98.0 | 90.0 | 95.0 | 95.0 | 95.0 | 95.0 | 95.0 | 95.0 |
| Amount of binder [ratio by weight] | 2.0 | 10.0 | 5.0 | 5.0 | 5.0 | 5.0 | 5.0 | 5.0 |
| Amount of added $ZrO_2$ [parts by weight] | 3.0 | 3.0 | 8.0 | 1.0 | 3.0 | 3.0 | 3.0 | 3.0 |

TABLE 2-continued

|  | Example |  |  |  |  |  |  |  |
| --- | --- | --- | --- | --- | --- | --- | --- | --- |
|  | 14 | 15 | 16 | 17 | 18 | 19 | 20 | 21 |
| Amount of added $TiO_2$ [parts by weight] | 5.0 | 5.0 | 5.0 | 5.0 | 10.0 | 1.0 | 5.0 | 5.0 |
| Amount of added ZnO [parts by weight] | 5.0 | 5.0 | 5.0 | 5.0 | 5.0 | 5.0 | 10.0 | 1.0 |
| Solid content concentration in coating liquid [wt. %] | 1.1 | 1.1 | 1.1 | 1.1 | 1.1 | 1.1 | 1.1 | 1.1 |
| Figured substrate Sm [μm] | 790 | 790 | 790 | 790 | 790 | 790 | 790 | 790 |
| Figured substrate Ra [μm] | 1.1 | 1.1 | 1.1 | 1.1 | 1.1 | 1.1 | 1.1 | 1.1 |
| Average inclination angle θ [°] | 0.32 | 0.32 | 0.32 | 0.32 | 0.32 | 0.32 | 0.32 | 0.32 |
| Thickness of coating (at valley portion) [μm] | 183 | 182 | 178 | 174 | 192 | 190 | 192 | 190 |
| Reflected color | Blue | Very light blue | Very light blue | Very light blue | Very light blue | Very light blue | Very light blue | Very light blue |
| Appearance evaluation | Poor | Good | Good | Good | Good | Good | Good | Good |
| Transmittance gain [%] | 2.79 | 2.52 | 2.48 | 2.60 | 2.54 | 2.46 | 2.57 | 2.61 |
| Average reflectance [%] | 1.6 | 1.8 | 1.9 | 1.75 | 1.83 | 1.8 | 1.7 | 1.7 |
| Reflectance loss [%] | −2.91 | −2.4 | −2.46 | −2.65 | −2.43 | −2.39 | −2.53 | −2.59 |
| High temperature high humidity test Transmittance change [%] | −0.56 | −0.05 | −0.10 | −0.27 | −0.27 | −0.25 | 0.05 | −1.2 |
| Alkali resistance evaluation Transmittance change [%] | −1.45 | −0.18 | −0.21 | −1.06 | −0.83 | −0.74 | −0.31 | −0.05 |

TABLE 3

|  | Comparative Example | |
| --- | --- | --- |
|  | 1 | 2 |
| Type of fine particles | PL-3L | PL-7 |
| Amount of fine particles [ratio by weight] | 95.0 | 85.0 |
| Amount of binder [ratio by weight] | 5.0 | 15.0 |
| Amount of added $ZrO_2$ [parts by weight] | 3.0 | 4.6 |
| Amount of added $TiO_2$ [parts by weight] | 5.0 | 0.0 |
| Amount of added ZnO [parts by weight] | 5.0 | 0.0 |
| Solid content concentration in coating liquid [wt. %] | 1.1 | 1.3 |
| Figured substrate Sm [μm] | 790 | 790 |
| Figured substrate Ra [μm] | 1.1 | 1.1 |
| Average inclination angle θ [°] | 0.32 | 0.32 |
| Thickness of coating (at valley portion) [μm] | 185 | 185 |
| Reflected color | Very light blue | White |
| Appearance evaluation | Good | Good |
| Transmittance gain [%] | 2.54 | 2.21 |
| Average reflectance [%] | 1.8 | 2 |
| Reflectance loss [%] | −2.42 | −2.65 |
| High temperature high humidity test Transmittance change [%] | −0.03 | −0.13 |
| Alkali resistance evaluation Transmittance change [%] | −0.17 | −0.03 |

TABLE 4

| | Example | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Fine silica particle dispersion liquid [parts by weight] | 49.8 | 49.8 | 49.5 | 49.8 | 47.7 | 50.1 | 49.8 | 49.8 | 49.8 | 49.8 | 49.8 | 49.8 | 49.8 |
| Ethyl cellosolve [parts by weight] | 47.5 | 47.5 | 48.5 | 47.5 | 48.9 | 46.5 | 47.5 | 47.5 | 47.5 | 47.5 | 47.5 | 47.5 | 47.5 |
| 1N hydrochloric acid [parts by weight] | 1.0 | 1.0 | 1.0 | 1.0 | 1 | 1.0 | 1.0 | 1.0 | 1.0 | 1.0 | 1.0 | 1.0 | 1.0 |
| Tetraethoxysilane [parts by weight] | 1.7 | 1.7 | 1.0 | 1.7 | 2.4 | 2.4 | 1.7 | 1.7 | 1.7 | 1.7 | 1.7 | 1.7 | 1.7 |
| Total [parts by weight] | 100 | 100 | 100 | 100 | 100 | 100 | 100 | 100 | 100 | 100 | 100 | 100 | 100 |
| Raw material liquid [parts by weight] | 10.00 | 10.00 | 10.00 | 8.50 | 8.50 | 10.00 | 10.00 | 10.00 | 10.00 | 10.00 | 10.00 | 10.00 | 42.00 |
| 1-methoxy-2-propanol [parts by weight] | 67.69 | 67.69 | 67.96 | 71.11 | 71.21 | 67.96 | 67.61 | 67.73 | 67.55 | 67.78 | 67.58 | 67.80 | |
| Ethylene glycol [parts by weight] | 5.00 | 5.00 | 5.00 | 2.00 | 2.00 | 5.00 | 5.00 | 5.00 | 5.00 | 5.00 | 5.00 | 5.00 | |
| Propylene glycol [parts by weight] | | | | | | | | | | | | | 27.26 |
| 3-methoxy-1-butanol [parts by weight] | | | | | | | | | | | | | |
| 2-propanol [parts by weight] | 16.38 | 16.38 | 16.38 | 17.78 | 17.80 | 16.38 | 16.39 | 16.39 | 16.34 | 16.41 | 16.35 | 16.42 | |
| Diacetylacetone [parts by weight] | | | | | | | | | | | | | 27.26 |
| $ZrCl_2O \cdot 8H_2O$ (50% aqueous solution) [parts by weight] | 0.16 | 0.16 | 0.16 | 0.13 | 0.13 | 0.16 | 0.26 | 0.10 | 0.16 | 0.16 | 0.16 | 0.16 | 0.66 |
| Ti chelating agent (75% IPA solution) [parts by weight] | 0.30 | 0.30 | 0.30 | 0.26 | 0.26 | 0.30 | 0.30 | 0.30 | 0.49 | 0218 | 0.30 | 0.30 | 1.28 |
| $ZnNO_3 \cdot 6H_2O$ (50% aqueous solution) [parts by weight] | 0.37 | 0.37 | 0.37 | 0.12 | 0.00 | 0.37 | 0.37 | 0.37 | 0.37 | 0.37 | 0.51 | 0.22 | 1.54 |
| L7001 (10% IPA solution) [parts by weight] | | | | 0.10 | 0.10 | | | | | | | | |
| F251 (10% IPA solution) [parts by weight] | 0.10 | 0.20 | 0.10 | | | 0.10 | 0.10 | 0.10 | 0.10 | 0.10 | 0.10 | 0.10 | |
| Total [parts by weight] | 100 | 100 | 100 | 100 | 100 | 100 | 100 | 100 | 100 | 100 | 100 | 100 | 100 |
| Drying temperature [° C.]/Drying time [seconds] | 350/80 | 350/80 | 350/80 | 350/80 | 350/80 | 350/80 | 350/80 | 350/80 | 350/80 | 350/80 | 350/80 | 350/80 | 350/80 |
| Calcination temperature [° C.]/Calcination time [minutes] | 760/4 | 760/4 | 760/4 | 760/4 | 760/4 | 760/4 | 760/4 | 760/4 | 760/4 | 760/4 | 760/4 | 760/4 | 760/4 |

TABLE 5

| | Example | | | | | | | |
|---|---|---|---|---|---|---|---|---|
| | 14 | 15 | 16 | 17 | 18 | 19 | 20 | 21 |
| Fine silica particle dispersion liquid [parts by weight] | 49.3 | 50.5 | 49.8 | 49.8 | 49.8 | 49.8 | 49.8 | 49.8 |
| Ethyl cellosolve [parts by weight] | 49.0 | 45.0 | 47.5 | 47.5 | 47.5 | 47.5 | 47.5 | 47.5 |
| 1N hydrochloric acid [parts by weight] | 1.0 | 1.0 | 1.0 | 1.0 | 1.0 | 1.0 | 1.0 | 1.0 |
| Tetraethoxysilane [parts by weight] | 0.7 | 3.5 | 1.7 | 1.7 | 1.7 | 1.7 | 1.7 | 1.7 |
| Total [parts by weight] | 100 | 100 | 100 | 100 | 100 | 100 | 100 | 100 |
| Raw material liquid [parts by weight] | 10.00 | 10.00 | 10.00 | 10.00 | 10.00 | 10.00 | 10.00 | 10.00 |
| 1-methoxy-2-propanol [parts by weight] | 67.69 | 67.69 | 67.60 | 67.88 | 67.57 | 67.99 | 67.41 | 67.91 |
| Ethylene glycol [parts by weight] | 5.00 | 5.00 | 5.00 | 5.00 | 5.00 | 5.00 | 5.00 | 5.00 |
| Propylene glycol [parts by weight] | | | | | | | | |
| 3-methoxy-1-butanol [parts by weight] | | | | | | | | |

TABLE 5-continued

| | Example | | | | | | | |
|---|---|---|---|---|---|---|---|---|
| | 14 | 15 | 16 | 17 | 18 | 19 | 20 | 21 |
| 2-propanol [parts by weight] | 16.38 | 16.38 | 16.35 | 16.44 | 16.34 | 16.48 | 16.29 | 16.45 |
| Diacetylacetone [parts by weight] | | | | | | | | |
| $ZrCl_2O \cdot 8H_2O$ (50% aqueous solution) [parts by weight] | 0.16 | 0.16 | 0.42 | 0.05 | 0.16 | 0.16 | 0.16 | 0.16 |
| Ti chelating agent (75% IPA solution) [parts by weight] | 0.30 | 0.30 | 0.30 | 0.30 | 0.61 | 0.06 | 0.30 | 0.30 |
| $ZnNO_3 \cdot 6H_2O$ (50% aqueous solution) [parts by weight] | 0.37 | 0.37 | 0.37 | 0.37 | 0.37 | 0.37 | 0.73 | 0.07 |
| L7001 (10% IPA solution) [parts by weight] | | | | | | | | |
| F251 (10% IPA solution) [parts by weight] | 0.10 | 0.10 | 0.10 | 0.10 | 0.10 | 0.10 | 0.10 | 0.10 |
| Total [parts by weight] | 100 | 100 | 100 | 100 | 100 | 100 | 100 | 100 |
| Drying temperature [° C.]/Drying time [seconds] | 350/80 | 350/80 | 350/80 | 350/80 | 350/80 | 350/80 | 350/80 | 350/80 |
| Calcination temperature [° C.]/Calcination time [minutes] | 760/4 | 760/4 | 760/4 | 760/4 | 760/4 | 760/4 | 760/4 | 760/4 |

TABLE 6

| | Comparative Example | |
|---|---|---|
| | 1 | 2 |
| Fine silica particle dispersion liquid [parts by weight] | 49.8 | 56.8 |
| Ethyl cellosolve [parts by weight] | 47.5 | 37.0 |
| 1N hydrochloric acid [parts by weight] | 1.0 | 1.0 |
| Tetraethoxysilane [parts by weight] | 1.7 | 5.2 |
| Total [parts by weight] | 100 | 100 |
| Raw material liquid [parts by weight] | 10.00 | 12.95 |
| 1-methoxy-2-propanol [parts by weight] | 67.69 | |
| Ethylene glycol [parts by weight] | 5.00 | |
| Propylene glycol [parts by weight] | | |
| 3-methoxy-1-butanol [parts by weight] | | 9.96 |
| 2-propanol [parts by weight] | 16.38 | 76.49 |
| Diacetylacetone [parts by weight] | | |
| $ZrCl_2O \cdot 8H_2O$ (50% aqueous solution) [parts by weight] | 0.16 | 0.40 |
| Ti chelating agent (75% IPA solution) [parts by weight] | 0.30 | |
| $ZnNO_3 \cdot 6H_2O$ (50% aqueous solution) [parts by weight] | 0.37 | |
| L7001 (10% IPA solution) [parts by weight] | | 0.20 |
| F251 (10% IPA solution) [parts by weight] | 0.10 | |
| Total [parts by weight] | 100 | 100 |
| Drying temperature [° C.]/Drying time [seconds] | 350/80 | 350/80 |
| Calcination temperature [° C.]/Calcination time [minutes] | 760/4 | 760/4 |

INDUSTRIAL APPLICABILITY

The low reflection coating glass sheet according to the present invention is of great value for use in vehicle windows, shop windows, and glass materials for photoelectric conversion devices, in particular, for use in glass materials for photoelectric conversion devices.

The invention claimed is:

1. A low reflection coating glass sheet comprising:
   a glass sheet; and
   a low reflection coating formed on at least one principal surface of the glass sheet,
   wherein the low reflection coating is a porous film comprising:
      primary fine particles comprising silicon oxide as a main component; and
      a binder that binds the primary fine particles,
   the binder comprises silicon oxide,
   the primary fine particles are solid particles,
   at least 70% of the primary fine particles aggregate and form secondary particles,
   each of the secondary particles has a minor axis in a range from 25 to 50 nm and a major axis in a range from 55 to 120 nm, where the major axis and the minor axis are set so that an aspect ratio defined as a ratio of the major axis relative to the minor axis of the secondary particle is in a range from 1.8 to 3,
   each of the secondary particles is an aggregated particle of only two of the primary fine particles,
   the primary fine particles other than the primary particles forming the secondary particles are present in the form of unaggregated primary particles, and
   the low reflection coating has a thickness in a range from 50 to 250 nm.

2. The low reflection coating glass sheet according to claim 1,
   wherein a transmittance gain of the low reflection coating glass sheet is in a range of 2.6% or more, where the transmittance gain is defined as an increment of an average transmittance of the glass sheet between before and after formation of the low reflection coating on the glass sheet, as measured with light having wavelengths ranging from 380 to 1100 nm.

3. The low reflection coating glass sheet according to claim 1,
   wherein the primary fine particles comprise silica.

4. The low reflection coating glass sheet according to claim 1,
   wherein a ratio by weight of a silicon oxide component contained in the primary fine particles relative to a silicon oxide component contained in the binder is from 90:10 to 97:3, as calculated in terms of a content of $SiO_2$.

5. The low reflection coating glass sheet according to claim 1,
   wherein the low reflection coating further comprises:
   from 2 to 6 parts by weight of zirconium oxide;
   from 3 to 8 parts by weight of titanium oxide; and
   from 0 to 7 parts by weight of zinc oxide, per 100 parts by weight, in total, of a silicon oxide component contained in the primary fine particles and a silicon oxide component contained in the binder,
   provided that a total content of zirconium oxide, titanium oxide, and zinc oxide is within a range from 5 to 17 parts by weight.

6. A method for producing the low reflection coating glass sheet according to claim 1, comprising:
   applying a coating liquid, which forms the low reflection coating, comprising: primary fine particles; a metal compound; and a surfactant, onto at least one principal surface of a glass sheet,
      wherein the primary fine particles comprise silicon oxide as a main component, and
      the metal compound serves as a source of a binder that binds the primary fine particles and that comprises silicon oxide; and
   heating the glass sheet on which the coating liquid is applied so as to produce the binder from the metal compound and thus to form a low reflection coating.

\* \* \* \* \*